United States Patent
Yamauchi

(10) Patent No.: US 6,826,074 B2
(45) Date of Patent: Nov. 30, 2004

(54) SEMICONDUCTOR MEMORY DEVICE

(75) Inventor: Hiroyuki Yamauchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/623,691

(22) Filed: Jul. 22, 2003

(65) Prior Publication Data

US 2004/0109344 A1 Jun. 10, 2004

(30) Foreign Application Priority Data

Jul. 24, 2002 (JP) ........................................ 2002-214822

(51) Int. Cl.[7] .............................................. G11C 11/00
(52) U.S. Cl. .................................. 365/154; 365/230.06
(58) Field of Search ............................. 365/154, 230.06

(56) References Cited

U.S. PATENT DOCUMENTS

| | | | |
|---|---|---|---|
| 4,758,989 A | * 7/1988 | Davis et al. ................. | 714/766 |
| 5,257,238 A | 10/1993 | Lee et al. ............... | 365/230.06 |
| 5,278,785 A | * 1/1994 | Hazani ................... | 365/185.16 |
| 5,583,821 A | 12/1996 | Rose et al. ................. | 365/156 |
| 6,343,045 B2 | 1/2002 | Shau .......................... | 365/227 |

* cited by examiner

*Primary Examiner*—M. Tran
(74) *Attorney, Agent, or Firm*—McDermott Will & Emery LLP

(57) ABSTRACT

In a semiconductor memory device, a precharge potential for non-selected bit lines among a plurality of bit lines, supplied by a HPR voltage source, is set at a value (for example, ½ Vcc=0.4 V) lower than the power supply voltage Vcc (low voltage in the range of 0.5 V to 1.2 V; for example, 0.8 V) determining the high-level side potential of data stored in a memory cell. A potential for non-selected word lines among a plurality of word lines, supplied by a NWL voltage source, is set at a predetermined negative potential (for example, −¼ Vcc=−0.2 V). The total of the precharge potential (0.4 V) of non-selected bit lines and the absolute value of the negative potential (−0.2 V) of non-selected word lines is set at a value less than the power supply voltage Vcc (0.8 V). By these settings, gate leakage current and GIDL current can be effectively limited to a small value while realizing effective limitation of OFF leakage current in a plurality of memory cells.

24 Claims, 12 Drawing Sheets

FIG. 4

| | | LARGE NEGATIVE VOLTAGE (-Vcc~-Vcc/2) | INTERMEDIATE NEGATIVE VOLTAGE (-Vcc/3~-Vcc/4) | SMALL NEGATIVE VOLTAGE (-Vcc/6~0V) |
|---|---|---|---|---|
| NON-SELECTED WORD LINE (NWL VOLTAGE SOURCE) | OFF LEAKAGE CURRENT | VERY SMALL | INTERMEDIATE | [VERY LARGE] |
| | GATE LEAKAGE CURRENT | [VERY LARGE] | INTERMEDIATE | SMALL |
| | GIDL LEAKAGE CURRENT | [VERY LARGE] | INTERMEDIATE | SMALL |

| | | HIGH POTENTIAL PRECHARGE (Vpre=Vcc) | INTERMEDIATE POTENTIAL PRECHARGE (Vpre=Vcc/2) | LOW POTENTIAL PRECHARGE (Vpre=Vcc/3~0V) |
|---|---|---|---|---|
| NON-SELECTED BIT LINE (HPR VOLTAGE SOURCE) | OFF LEAKAGE CURRENT | INTERMEDIATE | SMALL | INTERMEDIATE |
| | GATE LEAKAGE CURRENT | LARGE | SMALL | [LARGE] |
| | GIDL LEAKAGE CURRENT | LARGE | SMALL | [LARGE] |

| | | HIGH POTENTIAL LOW LEVEL (Vsn=Vcc/2) | INTERMEDIATE POTENTIAL LOW LEVEL (Vsn=Vcc/4) | LOW POTENTIAL LOW LEVEL (Vsn=0V) |
|---|---|---|---|---|
| NON-SELECTED SOURCE LINE (OSN VOLTAGE SOURCE) | OFF LEAKAGE CURRENT | VERY SMALL (DATA RETENTION UNSTABLE) | INTERMEDIATE | [LARGE] |
| | GATE LEAKAGE CURRENT | UNRELATED (DATA RETENTION UNSTABLE) | UNRELATED | UNRELATED |
| | GIDL LEAKAGE CURRENT | VERY SMALL (DATA RETENTION UNSTABLE) | INTERMEDIATE | SMALL |

FIG. 5

| STATE | | VOLTAGE SOURCE | SELECTED | NON-SELECTED |
|---|---|---|---|---|
| DURING OPERATION | Mode-A (HIGH TEMPERATURE) | NWL VOLTAGE SOURCE (WORD LINE) | Vcc | -1/3 Vcc |
| | | HPR VOLTAGE SOURCE (BIT LINE) | 1/2 Vcc~Vcc | 1/2 Vcc |
| | | OSN VOLTAGE SOURCE (SOURCE LINE) | Vss | 1/3 Vcc |
| | Mode-B (LOW TO ROOM TEMPERATURE) | NWL VOLTAGE SOURCE (WORD LINE) | Vcc | -1/4 Vcc |
| | | HPR VOLTAGE SOURCE (BIT LINE) | 1/2 Vcc~Vcc | 1/2 Vcc |
| | | OSN VOLTAGE SOURCE (SOURCE LINE) | Vss | 1/4 Vcc |
| DURING STANDBY | Mode-C (HIGH TEMPERATURE) | NWL VOLTAGE SOURCE (WORD LINE) | | -1/3 Vcc |
| | | HPR VOLTAGE SOURCE (BIT LINE) | | floating |
| | | OSN VOLTAGE SOURCE (SOURCE LINE) | | 1/3 Vcc |
| | Mode-D (LOW TO ROOM TEMPERATURE) | NWL VOLTAGE SOURCE (WORD LINE) | | -1/4 Vcc |
| | | HPR VOLTAGE SOURCE (BIT LINE) | | floating |
| | | OSN VOLTAGE SOURCE (SOURCE LINE) | | 1/4 Vcc |

SEMICONDUCTOR MEMORY DEVICE

BACKGROUND OF THE INVENTION

The present invention relates to a semiconductor memory device and a semiconductor integrated circuit including the semiconductor memory device. In particular, the present invention relates to a technology of effectively reducing leakage current of transistors in the case of using high-integration, high-density devices of a design rule in the generation of 0.13 μm gate length or later and operating at a power supply voltage as low as 1.2 V or less.

In general, to operate a semiconductor memory device at high speed even under low voltage, technologies using transistors having a low threshold voltage as its constituent transistors are adopted.

Use of a transistor having a low threshold voltage causes a problem that a large amount of OFF leakage current flows between the source and the drain of the transistor even during OFF periods. To solve this problem, conventionally, a negative voltage is set for word lines, and the source potential is shifted toward a positive potential, for example, to thereby effectively apply a negative bias to the transistor and thus limit the OFF leakage current to a small value.

Applying a large negative voltage to word lines and shifting the source voltage toward a positive potential are effective technologies producing no side effect when the device is sufficiently resistant to voltages. However, as the gate oxide film is thinned to below 2 nanometers with implementation of finer devices, a problem of gate leakage caused by a tunnel current arises. The conventionally proposed technology of driving word lines with a negative voltage and technology of offsetting source lines mentioned above increase the gate-source potential difference. Therefore, while succeeding in minimizing the OFF leakage current, these technologies disadvantageously cause a problem of increasing the gate leakage current.

With implementation of finer devices, the electric field between the gate and the drain of a transistor increases. This gives rise to a problem of gate-induced drain leakage (GIDL) current generated when a large potential difference is applied between the gate and the drain. The conventional technologies such as driving word lines with a negative voltage further induce this GIDL current, and thus have another problem of failing to minimize this new leakage current.

Leakage current from bit lines especially causes a problem. During data read operation, whether or not the potential of a precharged bit line has been drawn by a cell current is determined. Therefore, if there exists an amount of leakage current too large to be negligible with respect to the cell current, it is difficult to distinguish the cell current from the leakage current. As a result, it may take a long time before data read or erroneous data read may occur.

SUMMARY OF THE INVENTION

An object of the present invention is providing a semiconductor memory device capable of limiting gate leakage current and GIDL current to a small value while effectively limiting OFF leakage current.

To attain the object described above, in a semiconductor memory device of the present invention, the negative potential of non-selected word lines and the precharge potential of non-selected bit lines are appropriately set considering three types of leakage current, that is, OFF leakage current, gate leakage current and GIDL current. In addition, the potential of source lines of memory cells are appropriately set.

The semiconductor memory device of the present invention includes: a plurality of memory cells each drawing cell current according to data stored therein when selected; a plurality of word lines and a plurality of bit lines selected for accessing data in a specific memory cell among the plurality of memory cells; a power supply for providing a voltage corresponding to a high-level side potential of data in the plurality of memory cells; a word line potential supply source for supplying a potential to the plurality of word lines; and a precharge potential supply source for supplying a precharge potential to the plurality of bit lines, wherein a precharge potential supplied to non-selected bit lines among the plurality of bit lines by the precharge potential supply source is set at a value lower than the voltage of the power supply, a potential supplied to non-selected word lines among the plurality of word lines by the word line potential supply source is set at a predetermined negative value, and a total of the absolute value of the precharge potential of the non-selected bit lines supplied by the precharge potential supply source and the absolute value of the potential of the non-selected word lines supplied by the word line potential supply source is a value less than the voltage of the power supply.

In the semiconductor memory device described above, the precharge potential of the non-selected bit lines supplied by the precharge potential supply source may be set at a value less than half of the voltage of the power supply.

In the semiconductor memory device described above, a precharge potential supplied to a selected bit line among the plurality of bit lines by the precharge potential supply source may be set at a value higher than the precharge potential supplied to the non-selected bit lines by the precharge potential supply source and equal to or more than the half of the voltage of the power supply.

In the semiconductor memory device described, each of transistors constituting the plurality of memory cells may be constructed of a transistor in which the difference in current amount per unit gate width between OFF leakage current and gate leakage current is within two orders of magnitude.

In the semiconductor memory device described above, the voltage of the power supply may be 0.5 V to 1.2 V.

In the semiconductor memory device described above, the negative potential supplied to the non-selected word lines by the word line potential supply source may be changed depending on ambient temperature.

In the semiconductor memory device described above, the absolute value of the negative potential supplied to the non-selected word lines by the word line potential supply source may be larger when the ambient temperature is high than when it is normal.

Alternatively, the semiconductor memory device of the present invention includes: a plurality of memory cells each drawing cell current according to data stored therein when selected; a plurality of word lines and a plurality of bit lines selected for accessing data in a specific memory cell among the plurality of memory cells; a power supply for providing a voltage corresponding to a high-level side potential of data in the plurality of memory cells; a plurality of source lines for providing a low-level side potential of data in the plurality of memory cells; a word line potential supply source for supplying a potential to the plurality of word lines; a precharge potential supply source for supplying a precharge potential to the plurality of bit lines; and a source potential supply source for supplying a potential to the plurality of source lines, wherein a precharge potential supplied to non-selected bit lines among the plurality of bit lines by the precharge potential supply source is set at a value lower than the voltage of the power supply, a potential supplied to non-selected word lines among the plurality of word lines by the word line potential supply source is set at a predetermined negative value, a potential supplied to non-selected source lines among the plurality of source lines by the source potential supply source is set at a predetermined positive value, a total of the absolute value of the precharge potential of the non-selected bit lines supplied by the precharge potential supply source and the absolute value of the potential of the non-selected word lines supplied by the word line potential supply source is set at a value less than the voltage of the power supply, and the absolute value of the potential of the non-selected word lines supplied by the word line potential supply source and the absolute value of the potential of the non-selected source lines supplied by the source potential supply source are roughly equal to each other.

The semiconductor memory device described above may further include a row decode circuit for selecting a word line from the plurality of word lines according to a row address received, wherein selection and non-selection of the plurality of source lines is performed based on the row address.

The semiconductor memory device described above may further include a column decoder for selecting a bit line pair from the plurality of bit lines according to a column address received, wherein selection and non-selection of the plurality of source lines is performed based on the column address.

In the semiconductor memory device described above, the positive potential supplied to the non-selected source lines by the source line potential supply source may be changed depending on ambient temperature.

In the semiconductor memory device described above, the positive potential supplied to the non-selected source lines by the source line potential supply source may be larger when the ambient temperature is high than when it is normal.

In the semiconductor memory device described above, the semiconductor memory device may be used for portable equipment having a normal operation mode and a standby mode, and the potential may be changed depending on the ambient temperature for the normal operation mode and the standby mode separately.

The semiconductor integrated circuit of the present invention includes: a semiconductor memory including a plurality of memory cells, a plurality of word lines and a plurality of bit lines selected for accessing data in a specific memory cell among the plurality of memory cells, a decode circuit for selecting any word line from the plurality of word lines, and a word line drive circuit for driving the selected word line in response to an output of the decode circuit received; and a semiconductor circuit including a transistor having a low threshold voltage and a transistor having a high threshold voltage, wherein the decode circuit of the semiconductor memory has a transistor of which a source line is connected to the ground potential, the transistor being constructed of a transistor having a low threshold voltage of the same type as the transistor having a low threshold voltage included in the semiconductor circuit, and the word line drive circuit of the semiconductor memory has a pull-down transistor of which a source line for pulling down the potential of the word line is connected to a negative potential supply line, the pull-down transistor being constructed of a transistor having a high threshold voltage of the same type as the transistor having a high threshold voltage included in the semiconductor circuit.

In the semiconductor integrated circuit described above, the absolute value of the high threshold voltage of the pull-down transistor of the word line drive circuit may be equal to or larger than the absolute value of the potential of the negative potential supply line.

In the semiconductor integrated circuit described above, the pull-down transistor of the word line drive circuit may include a parallel circuit having: a transistor having a low threshold voltage of which a source line is connected to the ground line; and a transistor having a high threshold voltage of which a source line is connected to the negative potential supply line.

In the semiconductor integrated circuit described above, in the semiconductor circuit, the transistor having a low threshold voltage may be a transistor including a gate oxide film or threshold adjusting impurity formed for a transistor constituting a logic circuit that is high in leakage current but operates at high speed, and the transistor having a high threshold voltage may be a transistor including a gate oxide film or threshold adjusting impurity formed for a transistor constituting a logic circuit that operates at low speed but is low in leakage current.

In the semiconductor integrated circuit described above, in the semiconductor circuit, the transistor having a low threshold voltage may be a transistor including a gate oxide film or threshold adjusting impurity formed for a transistor constituting a logic circuit, and the transistor having a high threshold voltage may be a transistor including a gate oxide film or threshold adjusting impurity formed for a transistor constituting an analog circuit and/or an I/O circuit.

In the semiconductor integrated circuit described above, the power supply voltage supplied to the semiconductor memory and the semiconductor circuit may be 0.5 V to 1.2 V.

In the semiconductor integrated circuit described above, the semiconductor memory device may be an SRAM.

In the semiconductor integrated circuit described above, the semiconductor memory device may be a ROM.

Alternatively, the semiconductor integrated circuit of the present invention includes the semiconductor memory device described above and a semiconductor circuit including a transistor having a low threshold voltage and a transistor having a high threshold voltage, wherein the absolute value of the negative potential supplied to the non-selected word lines by the word line potential supply source of the semiconductor memory device is equal to or smaller than the absolute value of the high threshold voltage of the transistor of the semiconductor circuit.

According to the present invention, the precharge potential of the non-selected bit lines is set at a low value below the power supply voltage, and the pull-down potential of the non-selected word lines is set at a negative value. In addition, the total of the precharge potential of the non-selected bit lines and the absolute value of the negative potential of the non-selected word lines is set at a value less than the power supply voltage. By these settings, gate leakage current and GIDL current can be effectively limited to a small value while realizing effective limitation of OFF leakage current. Therefore, even when charge on the precharged bit lines is discharged by some amount by gate leakage current, the gate leakage current will be clearly distinguished from a cell current that has a meaning as data, and thus data read can be executed as originally intended swiftly and correctly. Moreover, even when GIDL current is generated to some extent from a storage node retaining "H" data in the SRAM to the substrate, a cell current will not be reduced so much, and thus data read can be executed as originally intended.

In particular, according to the present invention, the potential of the non-selected source lines is set at a positive value roughly equal to the absolute value of the potential of the non-selected word lines. This effectively limits OFF leakage current to a small value compared with the case of setting the potential of the non-selected source lines at the ground potential.

Moreover, according to the present invention, the negative potential supplied to the non-selected word lines and the positive potential supplied to the non-selected source lines are changed depending on the ambient temperature of the semiconductor memory device. This enables effective limitation of OFF leakage current, gate leakage current and GIDL current to a small value irrespective of change of the ambient temperature.

In addition, according to the present invention, when a negative potential is set for the non-selected word lines, the absolute value of the negative potential is made small as described above compared with the conventional case. Therefore, the transistor constituting the decode circuit of the semiconductor memory can be constructed of a transistor having a low threshold voltage of the same type as the transistor having a low threshold voltage originally included in the semiconductor circuit, and the pull-down transistor of the word line drive circuit of the semiconductor memory can be constructed of a transistor having a high threshold voltage of the same type as the transistor having a high threshold voltage included in the semiconductor circuit. Accordingly, the number of transistors used to constitute the word line drive circuit can be small and thus the layout area can be reduced, compared with the conventional word line drive circuit.

BRIEF DESCRIPTION OF THE DRAWINGS

FIG. 4 is a view showing the relationship between the settings of the pull-down potential of non-selected word lines, the precharge potential of non-selected bit lines and the positive potential of non-selected source lines and the three types of leakage current, gate leakage current, OFF leakage current and GIDL current.

FIG. 5 is a view showing the voltage settings of the NWL voltage source, a half-Vcc precharge (HPR) voltage source and an offset source node (OSN) voltage source under high temperature and under normal temperature (low to room temperature).

DESCRIPTION OF THE PREFERRED EMBODIMENTS

Hereinafter, preferred embodiments of the present invention will be described with reference to FIGS. 1 to 12.

(Embodiment 1)

Figure 1:
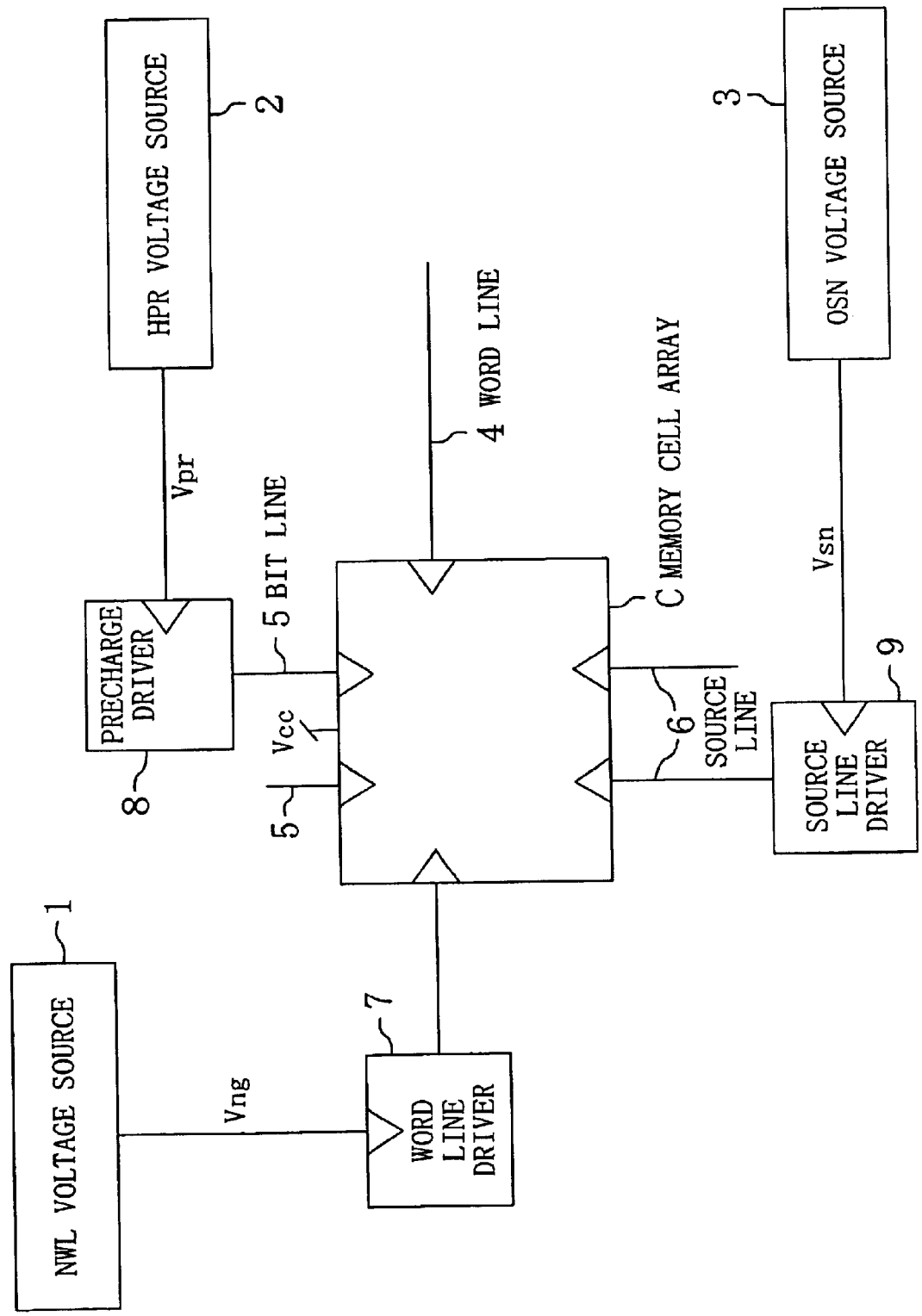
FIG. 1 is a schematic view of the entire configuration of a semiconductor memory device of Embodiment 1of the present invention.
Figure 2:
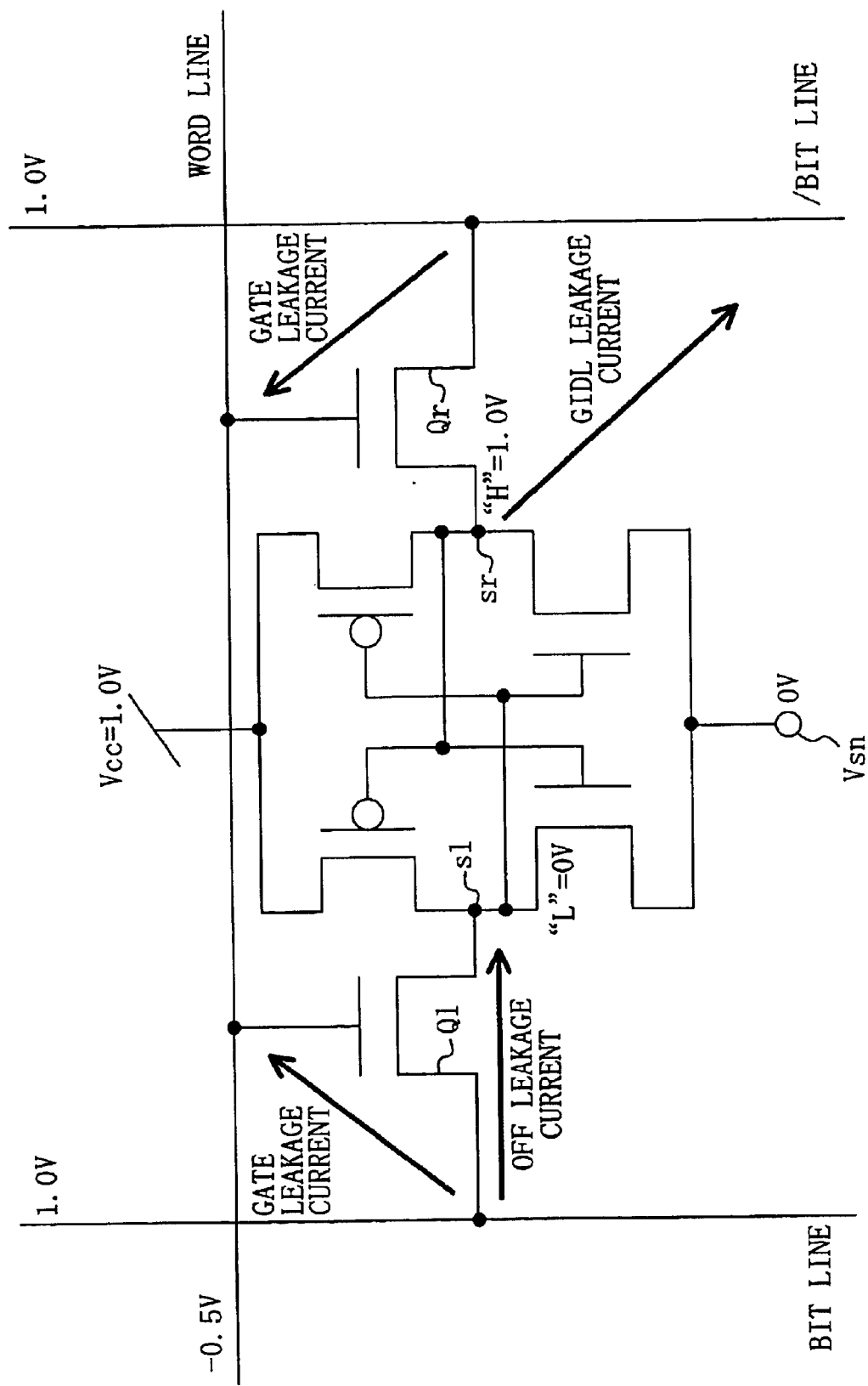
FIG. 2 is a view demonstrating influences of gate leakage current, OFF leakage current and GIDL current on data read from a memory cell to a bit line.
Figure 3:
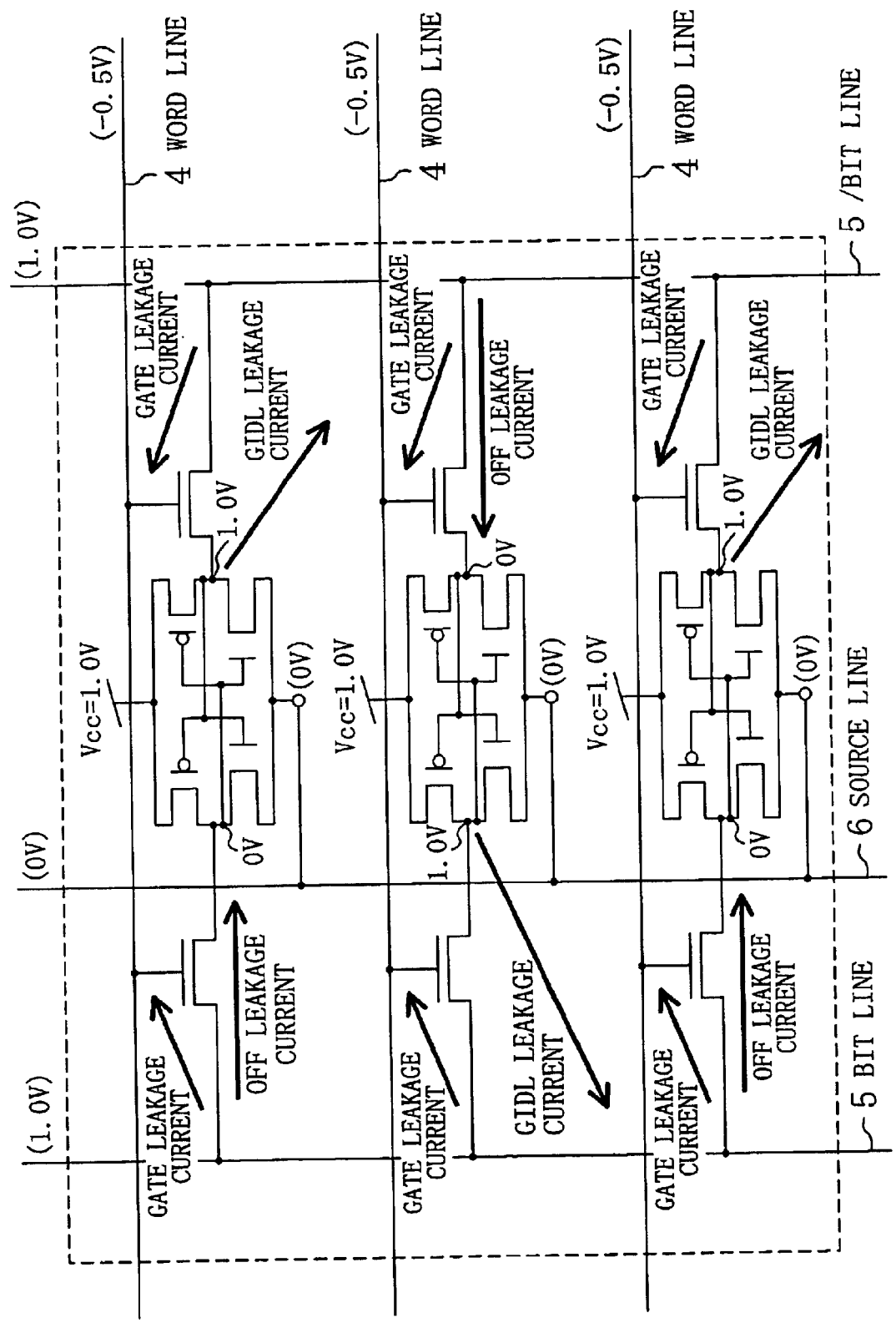
FIG. 3 is a view demonstrating how gate leakage current causes increase of power consumption of a negative word line (NWD) voltage source.

FIG. 1 shows an SRAM as the semiconductor memory device of Embodiment 1 of the present invention. Referring to FIG. 1, the semiconductor memory device includes a memory cell array C having a number of memory cells arranged in the row and column directions. As shown in FIG. 2, each of the memory cells includes two NMOS transistors and two PMOS transistors constituting two inverter circuits connected to each other to form a flipflop, and two access transistors Ql and Qr placed on the left and right of the flipflop. Each of the access transistors Ql and Qr is constructed of a transistor having a characteristic that it has a large amount of gate leakage current and the difference in current amount per unit gate width between OFF leakage current and gate leakage current is within two orders of magnitude. The present invention will be effective when applied to a configuration including such transistors Ql and Qr having this characteristic.

Referring to FIGS. 1 and 2, a bit line pair 5, 5 are connected to memory nodes sl and sr via the left and right access transistors Ql and Qr. A word line 4 is connected to the gates of the access transistors Ql and Qr. A power supply Vcc provides a high-level side potential of data stored in the memory cell and has a power supply voltage of 0.5 V to 1.2 V, for example. A source line 6 provides a low-level side potential of data stored in the memory cell. A plurality of such bit line pairs 5, 5 are arranged in the column direction, a plurality of such word lines 4 are arranged in the row direction, and a plurality of such source lines 6 are arranged in the column direction, for example.

A negative word line (NWL) voltage source (word line potential supply source) 1 supplies a negative potential Vng to the word line 4, and a word line driver 7 pulls down a non-selected word line 4 with the potential Vng generated by the NWL voltage source 1. A power supply half-Vcc precharge (HPR) voltage source 2 generates a precharge potential Vpr for the bit line 5, and a precharge driver 8 precharges the bit line 5 to the precharge potential Vpr generated by the HPR voltage source 2. An offset source node (OSN) voltage source 3 generates a potential Vsn for the source line 6, and a source line driver 9 drives the source line 6 with the potential Vsn generated by the OSN voltage source 3.

Hereinafter, described is the relationship among the word line negative potential Vn generated by the NWL voltage source 1, the precharge potential Vpr generated by the HPR voltage source 2, the source line potential Vsn generated by the OSN voltage source 3, and the power supply voltage (Vcc) of the power supply Vcc for providing a high-level side potential of data stored in the memory cell. FIG. 2 shows three typical types of leakage current that influence data read to the bit line 5, that is, OFF leakage current flowing between the source and the drain of the access transistor Ql, Qr in its OFF state, gate leakage current flowing from the bit line 5 toward the word line 4, and GIDL current induced from the gate toward the drain.

The gate leakage current is a current flowing from the bit line 5 toward the word line 4 when the bit line 5 is precharged to a predetermined precharge potential (for example, 1.0 V) in the state that a predetermined negative potential (for example, −0.5 V) is applied to the gate electrode of the access transistor Ql, Qr. If the word lines 4 are set at a large negative potential in an attempt of effectively reducing the OFF leakage current at the access transistor Ql connected to the memory node sl in which data "L (=0 V)" is stored, gate leakage current flows between non-selected word lines 4 and the bit line 5 in the memory cells connected to the bit line 5 (all the memory cells excluding the cell selected by the word line 4 (for example, 512−1=511 memory cells)). Therefore, despite the precharging of the bit line 5 to the predetermined precharge potential, the potential of the bit line 5 greatly drops due to the gate leakage current in the 511 memory cells. Assuming that about 1000 memory cells are connected to the bit line 5, the gate leakage current, which is as minute as 100 nanoamperes for each memory cell, will total to 100 microamperes. This total amount of gate leakage current is greater than the predicted value of cell current (for example, 50 microamperes), and therefore greatly influences data read with the bit line pair, making it difficult to distinguish the cell current from the gate leakage current.

The existence of gate leakage current also causes increase of the power consumption of the NWL voltage source 1 generating the pull-down potential Vng for the word lines 4. To state specifically, gate leakage current is generated at the number of positions twice as many as the number obtained by subtracting the number of memory cells connected to the selected word line from the number of cross points between the word lines and the bit line pairs (each including two bit lines), that is, the total number of memory cells. In the case of a 512 K-bit device, for example, gate leakage current flows into the NWL voltage source 1 from about a million memory cells via the word lines 4. The gate leakage current in this case totals to about 100 milliamperes (100 nanoamperes×1 million=100 milliamperes). Receiving this amount of gate leakage current, the NWL voltage source 1 increases the supply amount in an attempt of keeping the negative potential constant, and this results in increase of power consumption.

Figure 6:
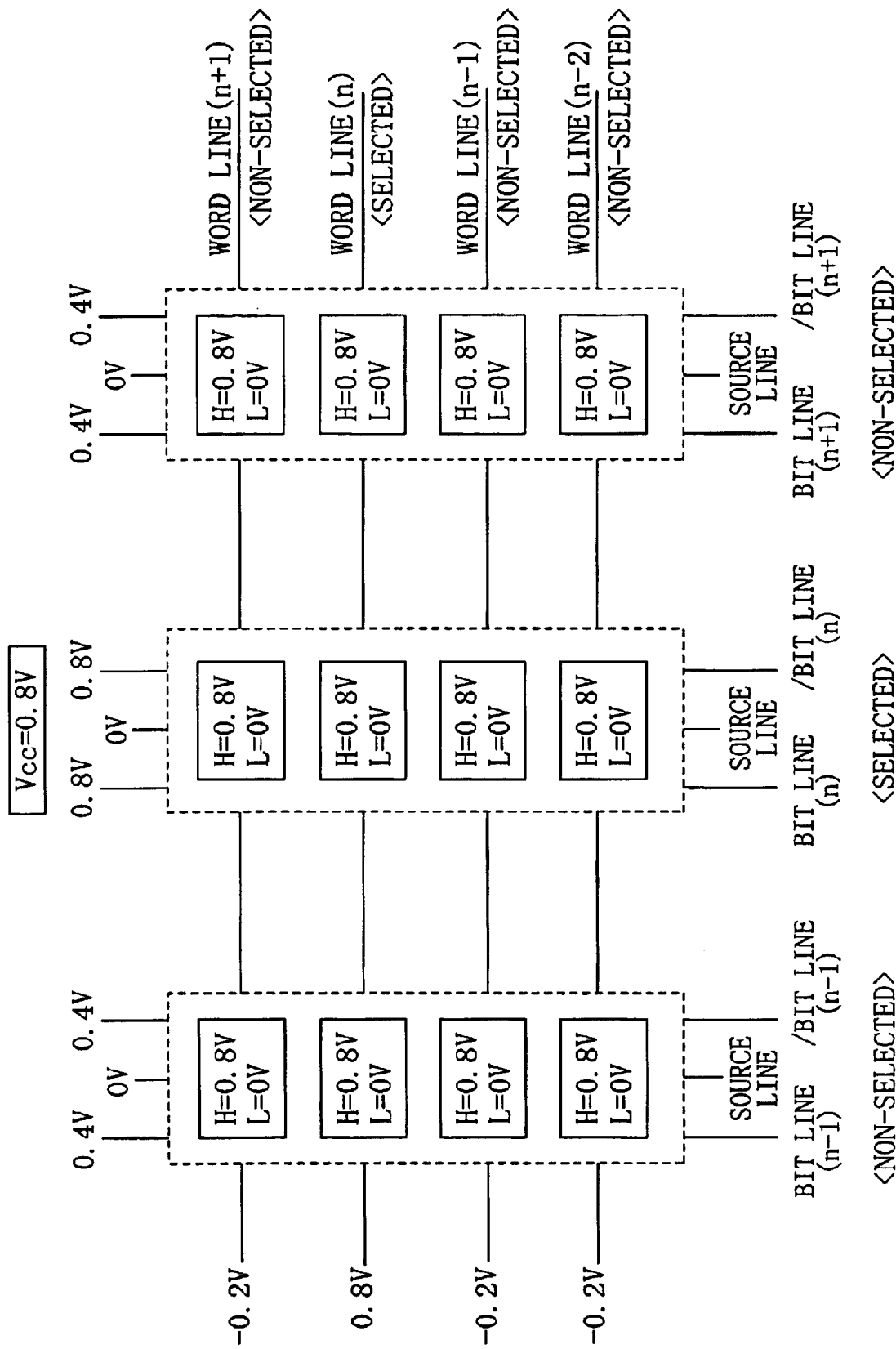
FIG. 6 is a view showing concrete voltage settings for selected and non-selected bit lines, word lines and source lines in the semiconductor memory device of Embodiment 1 of the present invention.

In view of the above, in this embodiment, in the case of setting the potential of non-selected word lines 4 at a negative value by the NWL voltage source 1 to minimize the OFF leakage current, the precharge potential Vpr for non-selected bit lines 5 generated by the BPR voltage source 2 is set at a value lower than the power supply voltage Vcc used as the potential on the high-level side of data in the memory cells, to thereby effectively minimize drop of the potential of the bit lines 5 caused by the gate leakage current at the access transistors Ql and Qr of the memory cells and thus minimize the resultant increase of the power consumption of the NWL voltage source 1. In addition, the total of the absolute value of the precharge potential Vpr and the absolute value of the negative potential of the word lines 4 is set to be less than the value of the power supply voltage Vcc. For example, in this embodiment, as shown in FIG. 6, when the power supply voltage Vcc is 0.8 V, for example, the negative potential Vng of the non-selected word lines 4 is set at −0.2 V (=−¼ Vcc) and the precharge potential Vpr of the non-selected bit lines 5 is set at 0.4V (=½ Vcc). By these settings, the total of the absolute value of the negative potential of the word lines 4 (0.2 V) and the absolute value of the precharge potential Vpr of the non-selected bit lines 5 (0.4 V) is 0.6 V, which is lower than the power supply voltage Vcc (0.8 V).

Accordingly, in this embodiment having the configuration described above, the gate leakage current at the access transistors Ql and Qr of each memory cell can also be effectively minimized even in the case of setting the potential of the non-selected word lines 4 at a negative value to minimize the OFF leakage current at the access transistors Ql and Qr of the memory cell.

Figure 7:
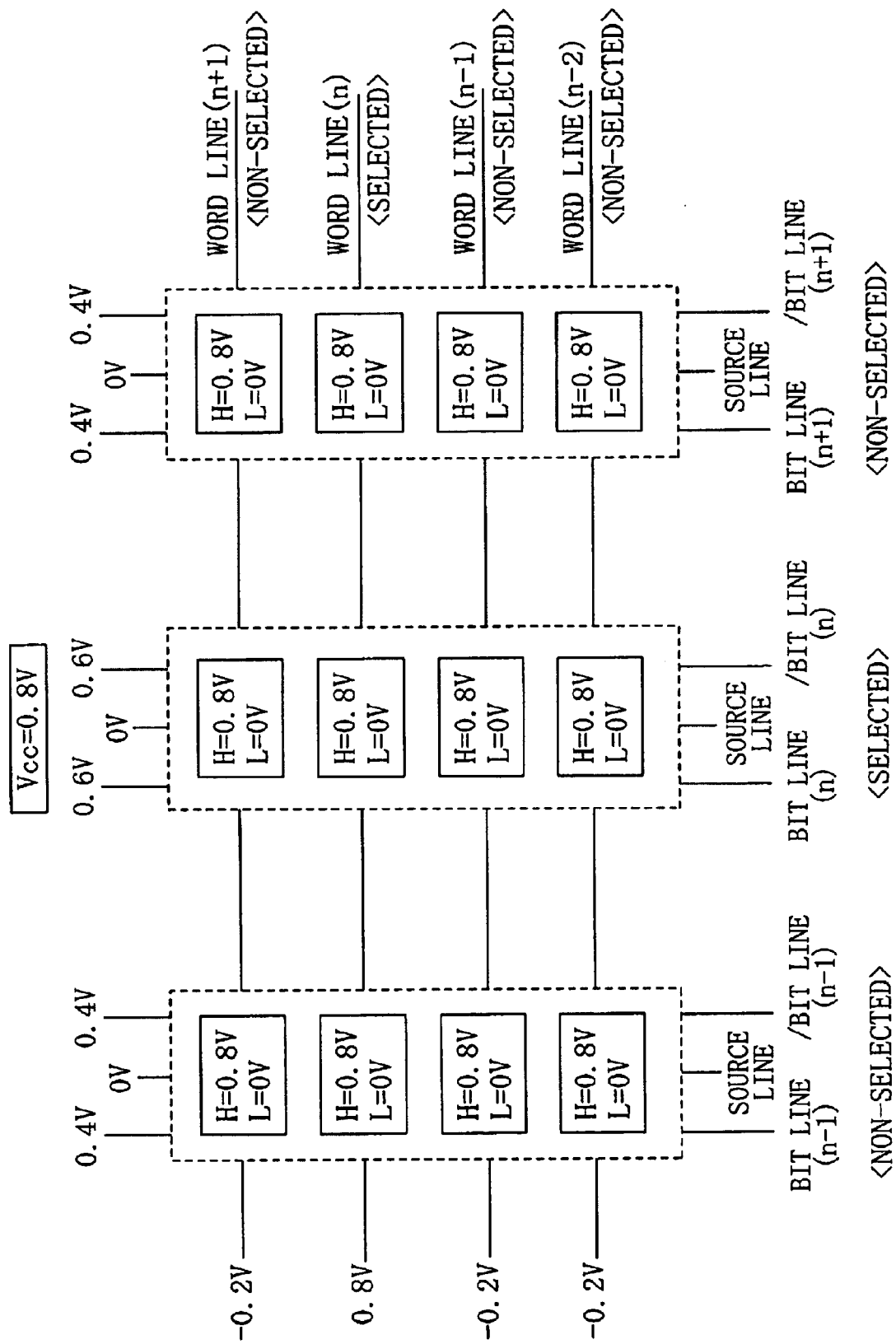
FIG. 7 is a view showing voltage settings in which only the setting of the precharge voltage of the selected bit line in FIG. 6 has been changed to further limit the gate leakage current.

In FIG. 6, the precharge potential Vpr of only the selected bit line 5 is set at the power supply voltage Vcc (=0.8 V). The reason for this is to increase the memory cell current by setting a high precharge potential Vpr. However, setting of a high precharge potential Vpr also increases gate leakage current. Therefore, the degree to which the precharge potential Vpr is increased should be appropriately determined considering the amount of the gate leakage current. When the number of selected bit lines 5 is evidently smaller than the number of non-selected bit lines 5, the gate leakage current in the selected memory cells may be neglected. Note however that in this case the read potential of the selected bit line 5 decreases. In this embodiment, as shown in FIG. 7, the precharge potential Vpr of the non-selected bit lines 5 is set at ½ Vcc (=0.4 V) and the precharge potential Vpr of the selected bit lines 5 is set at ¾ Vcc (=0.6 V), to minimize the gate leakage current while increasing the memory cell current.

Next, referring to FIG. 4, described are influences of the settings of the negative potential of the non-selected word lines 4, the precharge potential of the non-selected bit lines 5, and the potential of the non-selected source lines 6 on the OFF leakage current, the gate leakage current and the GIDL current.

As for the negative potential of the non-selected word lines 4, setting of an excessively large negative potential (−Vcc to −½ Vcc) causes very large gate leakage current and GIDL current. On the contrary, setting of an excessively small negative potential (−⅙ Vcc to 0 V) causes very large OFF leakage current. Accordingly, it is found that to minimize all of these three types of leakage current, the negative potential should be set to have an absolute value of ⅓ to ¼ of the power supply voltage Vcc (−⅓ Vcc to −¼ Vcc). In this embodiment, the negative potential is set at −¼ Vcc (−0.2 V).

As for the precharge potential of the non-selected bit lines 5, also, setting of a high potential (around the power supply potential Vcc) or a low potential (⅓ Vcc to 0 V) increases the potential difference between the precharge potential and the high-level side retained potential Vcc of the memory cells. This results in increase of both the gate leakage current and the GIDL current. By setting a middle (½ Vcc) precharge potential, both the gate leakage current and the GIDL current can be limited to a small value.

From the above, it is found appropriate to set the negative potential of the non-selected word lines 4 at about −⅓ Vcc to −¼ Vcc and the precharge potential of the non-selected bit lines 5 at ½ Vcc.

Figure 8:
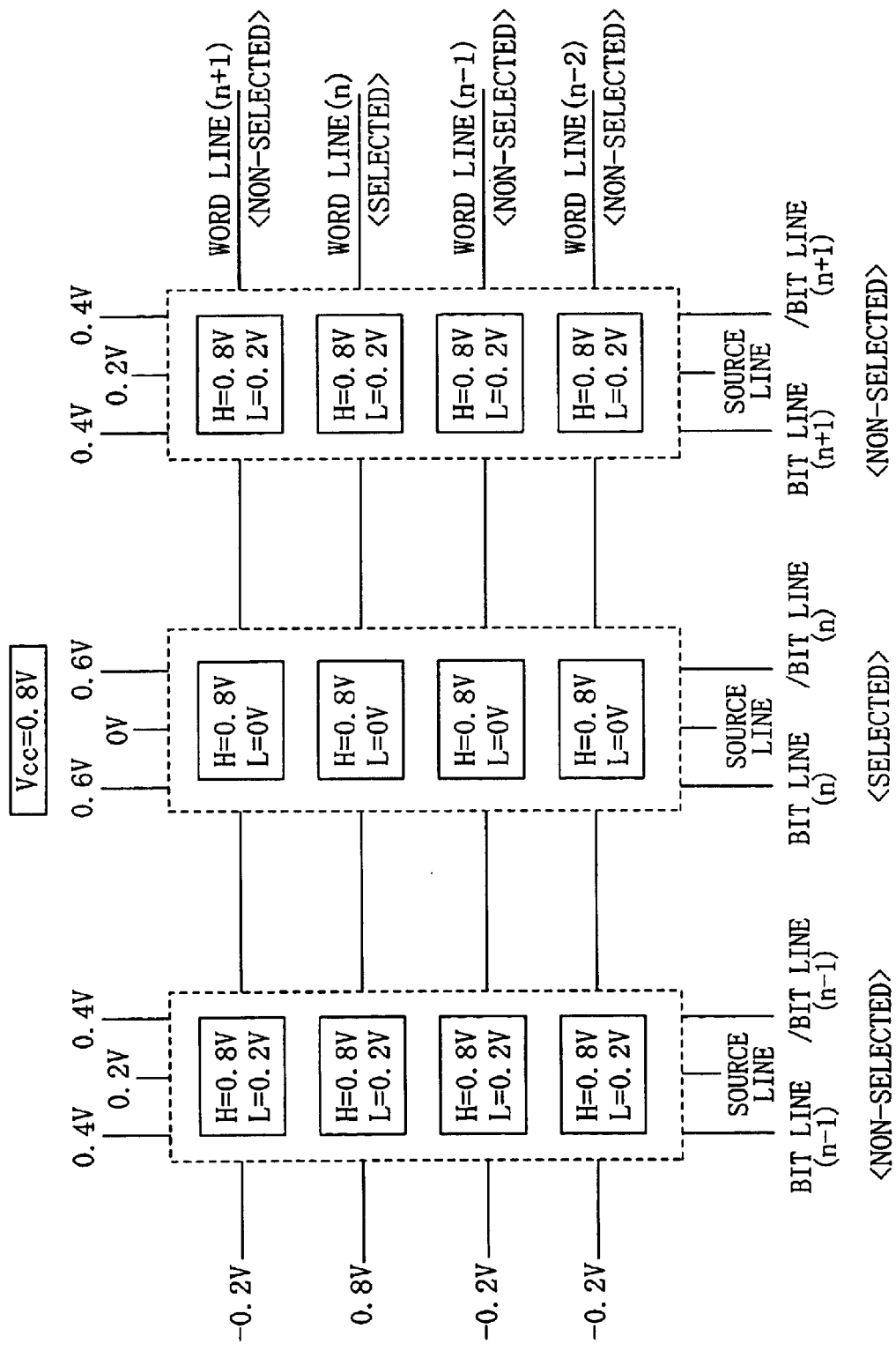
FIG. 8 is a view showing the case of using a column decode signal for selection/non-selection of source lines.

As for the non-selected source lines 6, as shown in FIG. 4, setting of a high potential of ½ Vcc or more decreases the potential difference between the power supply voltage Vcc and the source line potential. When the power supply voltage Vcc is less than 1.2 V, the potential difference becomes as small as below the total of the threshold voltages of the N-channel transistor and the P-channel transistor of the inverter constituting the memory cell. This minimizes the respective types of leakage current, but makes data retention unstable, which is therefore undesirable. On the contrary, setting of an excessively low potential increases the OFF leakage current, causing significant drop of the precharge potential of the bit lines 5. Therefore, it is found that the optimum potential to be set is around ¼ Vcc. Based on the examination results described above, the potential of the non-selected source lines 6 is set at ¼ Vcc (=0.2 V) with respect to the power supply voltage Vcc (=0.8 V) as shown in FIG. 8. This potential is equal to the absolute value of the negative potential (−¼ Vcc=−0.2 V) set for the non-selected word lines 4 described above.

Figure 9:
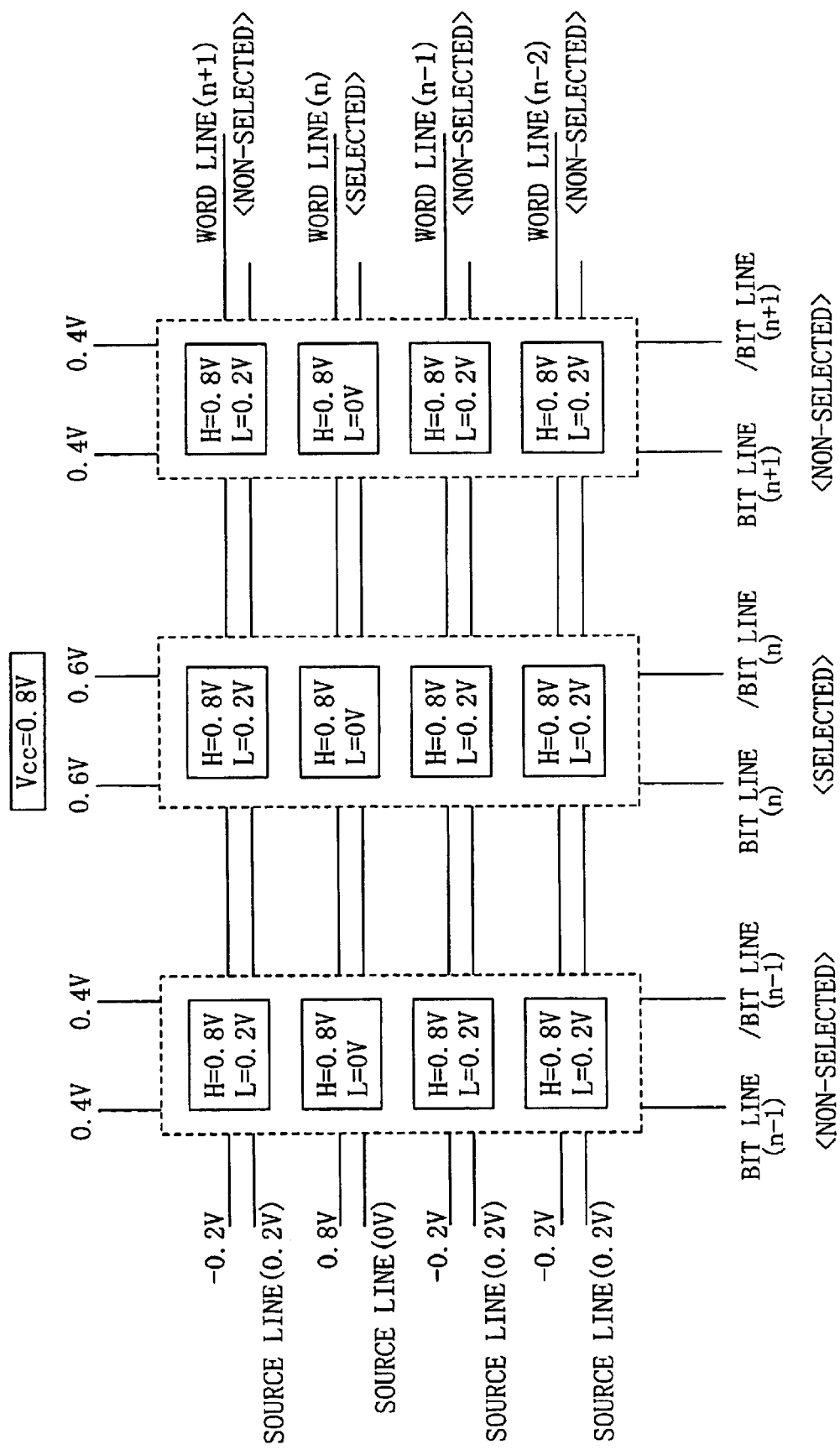
FIG. 9 is a view showing the case of using a row decode signal for selection/non-selection of source lines.

Selection/non-selection of the source lines 6 may be performed based on a selection address for the bit line group, that is, a column decode signal as shown in FIG. 8, or may be performed based on a selection address for the word line group, that is, a row decode signal as shown in FIG. 9.

Note that the amount of OFF leakage current changes by one order of magnitude with voltage change of 100 mV. Therefore, the voltage allowance of 100 mV is permitted in the setting of the negative potential of the non-selected word lines, and thus setting of the negative potential within this allowance is included in the present invention.

Next, temperature dependences of the three types of leakage current, that is, OFF leakage current, gate leakage current and GIDL current, will be described.

The OFF leakage current has temperature dependence, in which with rise of the ambient temperature around a transistor constituting the inverter by 1° C., the threshold potential of the transistor decreases by 1 mV Therefore, a temperature difference of 70° C., for example, will cause a change of the OFF leakage current by about ten times. On the contrary, the gate leakage current and the GIDL current are small in temperature dependence. Therefore, if the amounts of these three types of leakage current are roughly the same at room temperature, the OFF leakage current will be predominant when the temperature is high. In this case, therefore, a high priority must be put to reduction of the OFF leakage current. In reverse, when the temperature is low, the OFF leakage current will be small and instead the gate leakage current and the GIDL current will be predominant. In this case, therefore, a high priority must be put to reduction of the gate leakage current and the GIDL current.

In consideration of the above, in this embodiment, the following settings are made for the negative potential Vng of the non-selected word lines 4 supplied by the NWL voltage source 1, the precharge potential Vpr of the non-selected bit lines 5 supplied by the HPR voltage source 2, and the positive potential Vsn of the non-selected source lines 6 supplied by the OSN voltage source 3, as shown in FIG. 5. Portable equipment such as cellular phones, for which the SRAM of this embodiment is usable, have two modes, that is, a normal operation mode and a standby mode in which the frequency of access to the SRAM is lower than in the normal operation mode (for example, 10% or less). In view of this, in FIG. 5, two states of high temperature and normal temperature are given for each mode, so that the settings of the negative potential of the non-selected word lines 4 and the positive potential Vsn of the non-selected source lines 6 are changed depending on the ambient temperature. More specifically, in both the normal operation mode and the standby mode, the negative potential of the non-selected word lines 4 is set at −¼ Vcc under low to normal temperature, but is set at −⅓ Vcc under high temperature, to give a large change in the absolute value of the negative potential. Likewise, the positive potential Vsn of the non-selected source lines 6 is set at ¼ Vcc under low to normal temperature, but is greatly changed to ⅓ Vcc under high temperature in both the normal operation mode and the standby mode. That is to say, since the OFF leakage current tends to increase when the ambient temperature is high, the absolute value of the negative potential Vng of the non-selected word lines 4 is increased from |¼ Vcc| to |⅓ Vcc| to limit the OFF leakage current. Also, when the ambient temperature is high, the threshold voltage Vth of the transistors decreases, increasing the overdrive amount (Vcc−Vth) of the inverter constituting the latch node of the SRAM. Therefore, the positive potential Vsn of the non-selected source lines 6 can be changed accordingly from ¼ Vcc to ⅓ Vcc.

(Embodiment 2)

A semiconductor integrated circuit of Embodiment 2 of the present invention will be described with reference to FIG. 10. In this embodiment, the internal configuration of the word line driver of the SRAM described in Embodiment 1 will be discussed.

Figure 10:
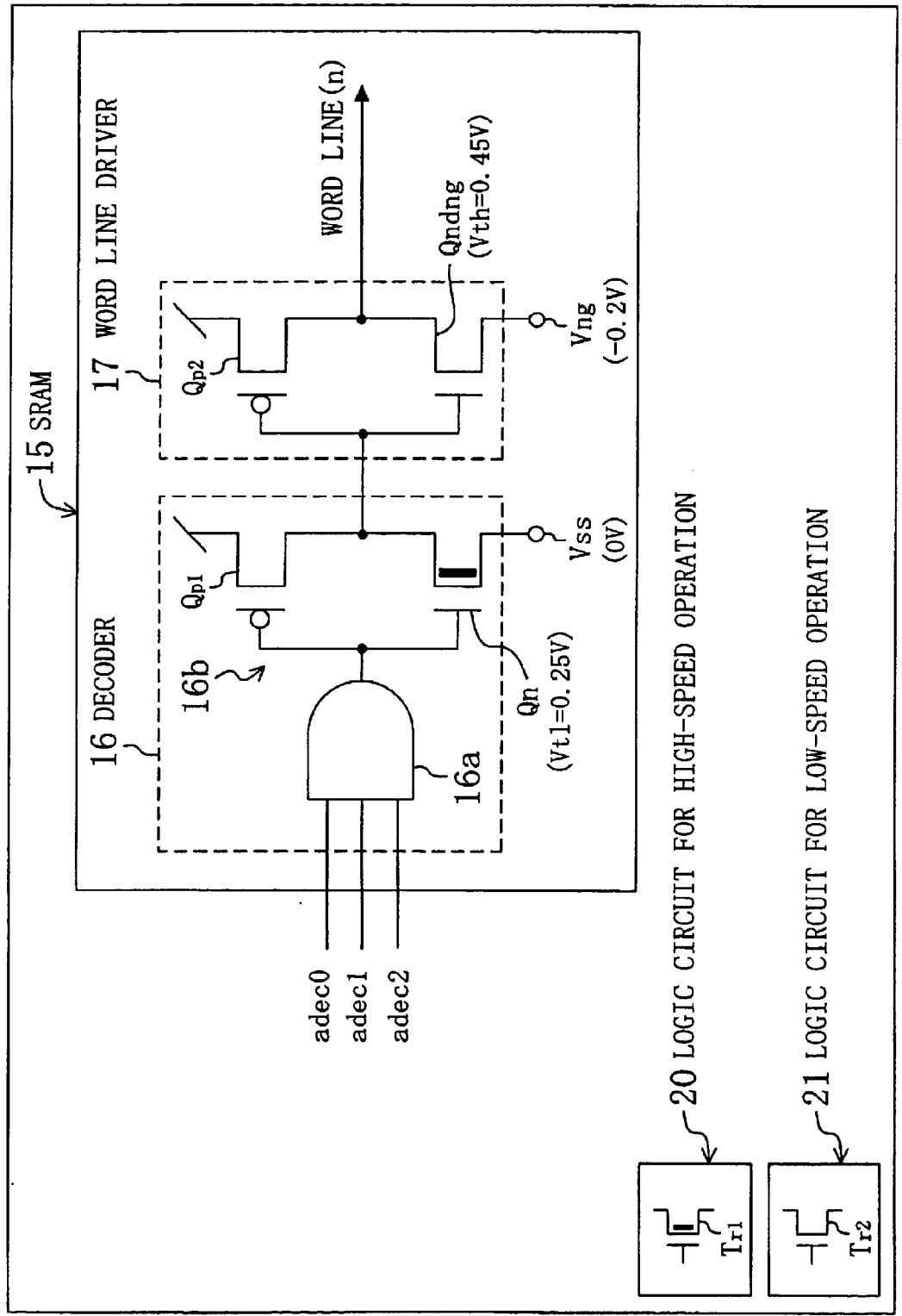
FIG. 10 is a schematic view of the entire configuration of a semiconductor integrated circuit of Embodiment 2 of the present invention.

Referring to FIG. 10, an SRAM 15 includes, although not shown, a plurality of memory cells, a plurality of bit lines and a plurality of word lines as described above with reference to FIG. 2 (only one word line 4 is shown in FIG. 10). The SRAM 15 further includes a decoder (decode circuit) 16 for selecting one word line from the plurality of word lines and a word line driver (word line drive circuit) 17 for driving the selected word line 4 in response to the output of the decoder 16. The SRAM 15 may have the configuration described in Embodiment 1.

In FIG. 10, the reference numerals 20 and 21 respectively denote a first logic circuit and a second logic circuit, which constitute a semiconductor circuit. The first logic circuit 20 includes a plurality of transistors Tr1 having a low threshold voltage Vtl that include a gate oxide film or threshold adjusting impurity formed for high-speed operation. The transistors Tr1 having the low threshold voltage Vtl operate at high speed but are comparatively large in leakage current. The second logic circuit 21 includes a plurality of transistors Tr2 having a high threshold voltage Vth that include a gate oxide film or threshold adjusting impurity formed for normal (low-speed) operation. The transistors Tr2 having the high threshold voltage Vth are small in leakage current.

The SRAM 15 and the first and second logic circuits 20 and 21 receive a low voltage of 0.5 V to 1.2 V from a low voltage power supply, as in Embodiment 1.

The decoder 16 of the SRAM 15 includes a NAND circuit essentially composed of an AND circuit 16a receiving decode signals adec0 to adec2 and an inverter 16b placed to follow the AND circuit 16a. The inverter 16b includes a P-channel transistor Qp1 receiving the power supply voltage and an N-channel transistor Qn. The N-channel transistor Qn has a source line connected to the ground potential Vss, and is constructed of a transistor of the same type as the transistors Tr1 having the low threshold voltage Vtl included in the first logic circuit 20 for high-speed operation, which has a low threshold voltage Vtl almost identical to that of the transistors Tr1.

The word line driver 17 of the SRAM 15 is constructed of an inverter receiving the output of the inverter 16b of the decoder 16. The inverter includes a P-channel transistor Qp2 receiving the power supply voltage and a pull-down transistor Qndng constructed of an N-channel transistor. The pull-down transistor Qndng has a source line connected to a supply line Vng having a negative potential of −0.2 V, for example. The negative potential supply line Vng receives a negative potential from the NWL voltage source 1 shown in FIG. 1, for example. The word line driver 17 having this configuration supplies the power supply voltage to the word line 4 via the P-channel transistor Qp2 during selection of the word line 4. During non-selection of the word line 4, the word line driver 17 connects the word line 4 to the negative potential supply line Vng via the pull-down transistor Qndng, to pull down the potential of the non-selected word line 4 to the negative potential.

The pull-down transistor Qndng of the word line driver 17 is constructed of a transistor of the same type as the transistors Tr2 having the high threshold voltage Vth included in the second logic circuit 21 for low-speed operation, which has a high threshold voltage Vth almost identical to that of the transistors Tr2.

Specifically, in this embodiment, the low threshold voltage Vtl of the transistor Qn of the decoder 16 is set at 0.25 V, the high threshold voltage Vth of the pull-down transistor Qndng of the word line driver 17 is set at 0.45 V, and the potential (Vng) of the negative potential supply line Vng is set at −0.2 V That is, the high threshold voltage Vth (=0.45 V) of the pull-down transistor Qndng is higher than the absolute value (=0.2 V) of the potential of the negative potential supply line Vng. In addition, in both the transistor Qn of the decoder 16 and the pull-down transistor Qndng, the difference between the gate-source voltage Vgs and the threshold voltage during OFF periods (Vg−Vss−Vtl, Vg−Vng−Vth) is set at −0.25 V, so that the amount of OFF leakage current of the transistor Qn is equal to that of the transistor Qndng.

In this embodiment, the word line driver 17 shown in FIG. 10 can be configured to be the same in the number of transistors and layout area as a general word line driver having no function of pulling down the word line 4 to a negative potential. The reason why the conventional driver for setting the potential of word lines at a negative value failed to adopt the configuration shown in FIG. 10 is that it was necessary to provide two types of transistors different in threshold voltage by a value corresponding to the negative potential difference. In other words, the negative potential conventionally set for the word lines needed to have a potential difference of at least −0.5 V to −1.5 V with respect to the ground potential. Therefore, it was common practice to implement a negative potential word line pull-down circuit using a level shift circuit, and this caused increase of the number of transistors and increase of the area. In particular, such a conventional technology was not usable for a semiconductor memory such as an embedded SRAM and an embedded ROM, which was required to downsize its peripheral circuits such as the decoder by reducing the number of components in order to be superior to others with regard to the cell occupation.

In this embodiment, however, since the power supply voltage Vcc is as low as in the range of 0.5 V to 1.2 V, the negative potential required for the non-selected word line 4 is −⅓ Vcc (about −0.3 V) to −¼ Vcc (−0.25 V) when Vcc=1.0 V, for example. Therefore, it is unnecessary to provide a transistor having a threshold voltage too high to be used for a semiconductor circuit other than the semiconductor memory. Instead, the potential difference (=−0.2 V) can be secured using the transistor Tr1 having a low threshold voltage (=0.25 V) included in the originally-placed logic circuit 20 for high-speed operation and the transistor Tr2 having a high threshold voltage (=0.45 V) included in the originally-placed logic circuit 21 for low-speed operation. Thus, it is possible to set the negative potential of the non-selected word line 4 at −0.2 V.

In this embodiment, the high threshold voltage of the transistors Tr2 included in the logic circuit 21 for low-speed operation was set at 0.45 V About 0.6 V is possible as the threshold voltage of a thick-film transistor for high voltage (1.5 V to 3.3 V). Therefore, the negative potential of the non-selected word line 4 can also be set at −0.35 V Naturally, an arbitrary potential difference can be given between the threshold voltages of two types of transistors within a practical range by changing the densities of various kinds of threshold adjusting impurity in transistors.

In this embodiment, the pull-down transistor Qndng of the word line driver 17 was constructed of a transistor of the same type (having almost the same high threshold voltage) as the transistors Tr2 having the high threshold voltage Vth included in the logic circuit 21 for low-speed operation. Alternatively, if a thick-film transistor for high voltage (1.5 V to 3.3 V) is provided as a component of an analog circuit or an I/O circuit, the pull-down transistor Qndng may be constructed of a transistor having almost the same high threshold voltage as the high threshold voltage of this thick-film transistor.

(Alteration to Word Line Driver)

Figure 11:
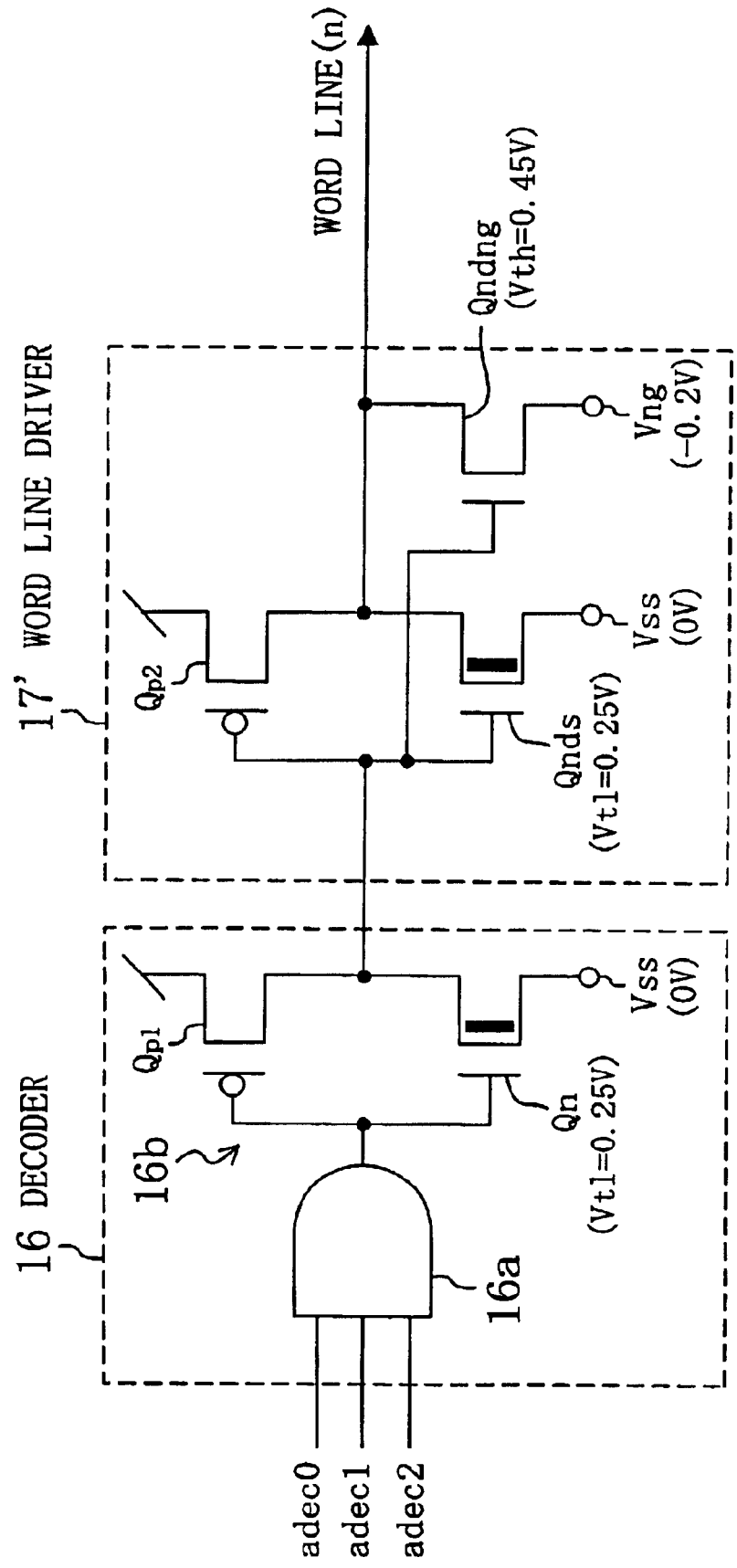
FIG. 11 is a view showing an alteration to a word line driver provided in the semiconductor integrated circuit of Embodiment 2.

FIG. 11 shows an alteration to the word line driver 17 shown in FIG. 10.

A word line driver 17' shown in FIG. 11 is different from the word line driver 17 shown in FIG. 10 in that a pull-down transistor Qndng and another pull-down transistor Qnds are placed in parallel with each other.

Like the pull-down transistor Qndng shown in FIG. 10, the pull-down transistor Qndng is constructed of a transistor having almost the same high threshold voltage Vth as the transistor Tr2 having the high threshold voltage Vth included in the logic circuit 21 for low-speed operation, and has a source line connected to the supply line of the negative potential Vng (=−0.2 V). The other pull-down transistor Qnds is constructed of a transistor having almost the same low threshold voltage Vtl as the transistor Tr1 having the low threshold voltage Vtl included in the logic circuit 20 for high-speed operation, and has a source line connected to the ground line.

In this alteration, therefore, pull-down of the word line 4 from the power supply voltage Vcc is performed in the following manner. The potential of the word line 4 is first pulled down to the ground level Vss by the pull-down transistor Qnds predominantly, and then pulled down to the level of the negative potential Vng (=−0.2 V) by the other pull-down transistor Qndng predominantly over a time period several times as long as the time period required for the first pull-down.

Desirably, a delay may be provided between the timings at which the pull-down transistors Qnds and Qndng are turned ON. It is however possible to obtain the function described above without necessarily providing such a delay if the two pull-down transistors are different in size so that they have clearly different current capabilities. For example, the gate length of the pull-down transistor Qndng may be made larger than that of the other pull-down transistor Qnds, or the gate width of the former may be made smaller than the latter.

(Embodiment 3)

As Embodiment 3 of the present invention, application of the present invention to a ROM as a semiconductor memory device will be described.

A ROM, having a large number of memory cells connected to one bit line, is greatly influenced by gate leakage current occurring at cell transistors placed between non-selected word lines and the bit line. As described before, OFF leakage current can be limited to a small value by setting the negative potential of the non-selected word lines at a large value (in absolute value). However, when the bit line is selectively precharged to the power supply voltage level, the potential difference between the bit line and the word lines exceeds the power supply voltage, causing increase of the gate leakage current. As a result, the potential of the precharged bit line largely drops by being pulled, not by a source line as originally intended, but by a plurality of non-selected word lines, causing read data sensing malfunction. If the potential of the source line is made excessively high, GIDL current flows from the drain to the substrate. In this case, also, the precharge potential of the bit line drops.

Figure 12:
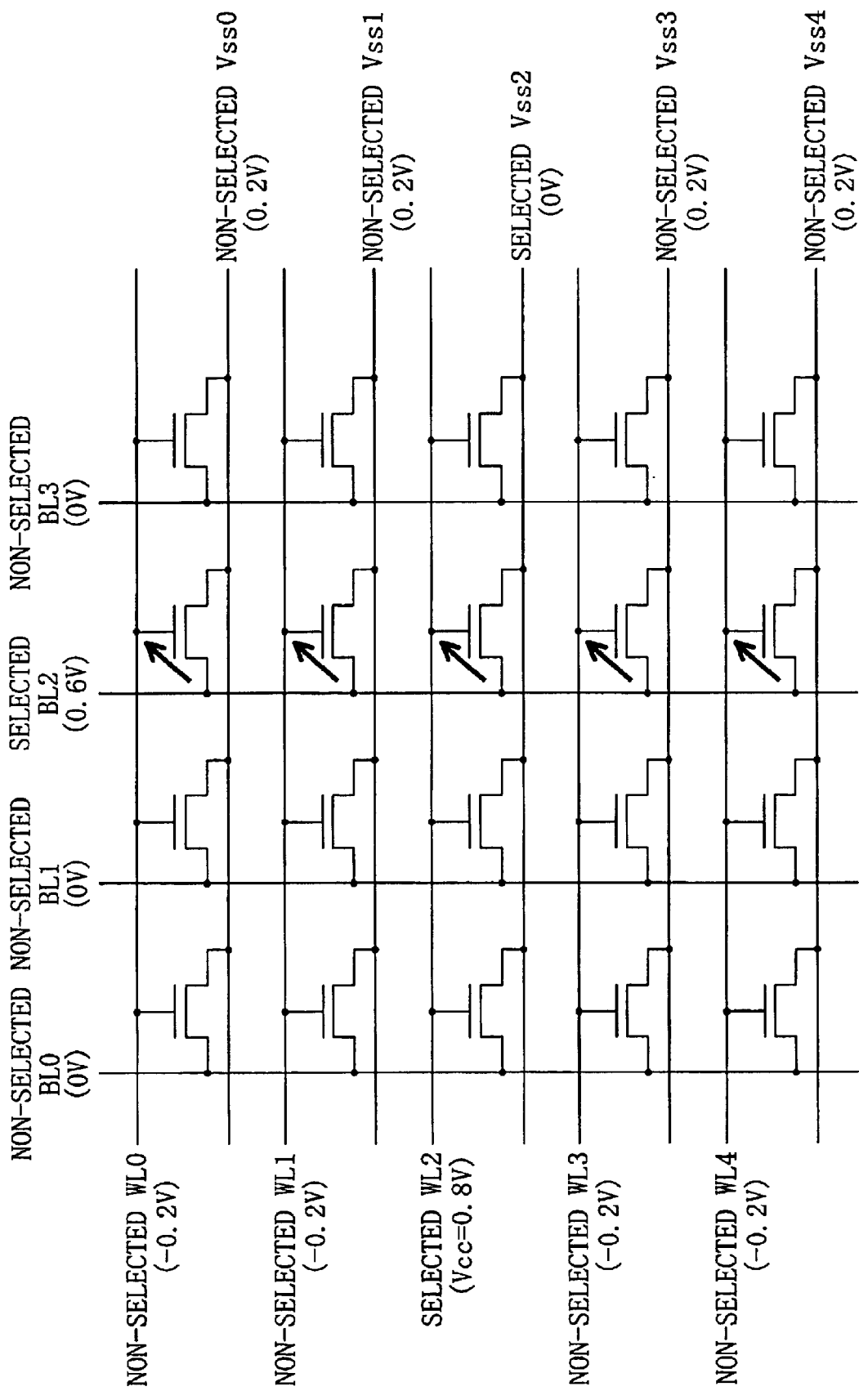
FIG. 12 is a view showing concrete voltage settings for selected and non-selected bit lines, word lines and source lines in a ROM of Embodiment 3 of the present invention.

As is found from the above, in a ROM, also, it is important to maintain the potential relationship as shown in FIG. 12. In FIG. 12, the precharge potential of the selected bit line, the potentials of the non-selected and selected word lines, and the potentials of the non-selected and selected source lines are the same as those described with reference to FIG. 9. The precharge potential of the non-selected bit lines is 0 V While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor memory device comprising:
   a plurality of memory cells each drawing cell current according to data stored therein when selected;
   a plurality of word lines and a plurality of bit lines selected for accessing data in a specific memory cell among the plurality of memory cells;
   a power supply for providing a voltage corresponding to a high-level side potential of data in the plurality of memory cells;
   a word line potential supply source for supplying a potential to the plurality of word lines; and
   a precharge potential supply source for supplying a precharge potential to the plurality of bit lines,
   wherein a precharge potential supplied to non-selected bit lines among the plurality of bit lines by the precharge potential supply source is set at a value lower than the voltage of the power supply,
   a potential supplied to non-selected word lines among the plurality of word lines by the word line potential supply source is set at a predetermined negative value, and
   a total of the absolute value of the precharge potential of the non-selected bit lines supplied by the precharge potential supply source and the absolute value of the potential of the non-selected word lines supplied by the word line potential supply source is a value less than the voltage of the power supply.

2. The device of claim 1, wherein the precharge potential of the non-selected bit lines supplied by the precharge potential supply source is set at a value less than half of the voltage of the power supply.

3. The device of claim 1, wherein a precharge potential supplied to a selected bit line among the plurality of bit lines by the precharge potential supply source is set at a value higher than the precharge potential supplied to the non-selected bit lines by the precharge potential supply source and equal to or more than the half of the voltage of the power supply.

4. The device of claim 1, wherein each of transistors constituting the plurality of memory cells is constructed of a transistor in which the difference in current amount per unit gate width between OFF leakage current and gate leakage current is within two orders of magnitude.

5. The device of claim 1, wherein the voltage of the power supply is 0.5 V to 1.2 V.

6. The device of claim 1, wherein the negative potential supplied to the non-selected word lines by the word line potential supply source is changed depending on ambient temperature.

7. The device of claim 6, wherein the absolute value of the negative potential supplied to the non-selected word lines by the word line potential supply source is larger when the ambient temperature is high than when it is normal.

8. The device of claim 6, wherein the semiconductor memory device is used for portable equipment having a normal operation mode and a standby mode, and
   the potential is changed depending on the ambient temperature for the normal operation mode and the standby mode separately.

9. The device of claim 1, wherein the semiconductor memory device is an SRAM.

10. The device of claim 1, wherein the semiconductor memory device is a ROM.

11. A semiconductor integrated circuit comprising:
    the semiconductor memory device of claim 1; and
    a semiconductor circuit including a transistor having a low threshold voltage and a transistor having a high threshold voltage,
    wherein the absolute value of the negative potential supplied to the non-selected word lines by the word line potential supply source of the semiconductor memory device is equal to or smaller than the absolute value of the high threshold voltage of the transistor of the semiconductor circuit.

12. A semiconductor memory device comprising:
    a plurality of memory cells each drawing cell current according to data stored therein when selected;
    a plurality of word lines and a plurality of bit lines selected for accessing data in a specific memory cell among the plurality of memory cells;
    a power supply for providing a voltage corresponding to a high-level side potential of data in the plurality of memory cells;
    a plurality of source lines for supplying a low-level side potential of data in the plurality of memory cells;
    a word line potential supply source for supplying a potential to the plurality of word lines;
    a precharge potential supply source for supplying a precharge potential to the plurality of bit lines; and
    a source potential supply source for supplying a potential to the plurality of source lines,
    wherein a precharge potential supplied to non-selected bit lines among the plurality of bit lines by the precharge potential supply source is set at a value lower than the voltage of the power supply,
    a potential supplied to non-selected word lines among the plurality of word lines by the word line potential supply source is set at a predetermined negative value, a potential supplied to non-selected source lines among the plurality of source lines by the source potential supply source is set at a predetermined positive value, a total of the absolute value of the precharge potential of the non-selected bit lines supplied by the precharge potential supply source and the absolute value of the potential of the non-selected word lines supplied by the word line potential supply source is set at a value less than the voltage of the power supply, and the absolute value of the potential of the non-selected word lines supplied by the word line potential supply source and the absolute value of the potential of the non-selected source lines supplied by the source potential supply source are roughly equal to each other.

13. The device of claim 12, further comprising a row decode circuit for selecting a word line from the plurality of word lines according to a row address received, wherein selection and non-selection of the plurality of source lines is performed based on the row address.

14. The device of claim 12, further comprising a column decoder for selecting a bit line pair from the plurality of bit lines according to a column address received, wherein selection and non-selection of the plurality of source lines is performed based on the column address.

15. The device of claim 12, wherein the positive potential supplied to the non-selected source lines by the source line potential supply source is changed depending on ambient temperature.

16. The device of claim 15, wherein the positive potential supplied to the non-selected source lines by the source line potential supply source is larger when the ambient temperature is high than when it is normal.

17. The device of claim 15, wherein the semiconductor memory device is used for portable equipment having a normal operation mode and a standby mode, and the potential is changed depending on the ambient temperature for the normal operation mode and the standby mode separately.

18. The device of claim 12, wherein the semiconductor memory device is an SRAM.

19. A semiconductor integrated circuit comprising:

a semiconductor memory including a plurality of memory cells, a plurality of word lines and a plurality of bit lines selected for accessing data in a specific memory cell among the plurality of memory cells, a decode circuit for selecting any word line from the plurality of word lines, and a word line drive circuit for driving the selected word line in response to an output of the decode circuit received; and a semiconductor circuit including a transistor having a low threshold voltage and a transistor having a high threshold voltage, wherein the decode circuit of the semiconductor memory has a transistor of which a source line is connected to the ground potential, the transistor being constructed of a transistor having a low threshold voltage of the same type as the transistor having a low threshold voltage included in the semiconductor circuit, and the word line drive circuit of the semiconductor memory has a pull-down transistor of which a source line for pulling down the potential of the word line is connected to a negative potential supply line, the pull-down transistor being constructed of a transistor having a high threshold voltage of the same type as the transistor having a high threshold voltage included in the semiconductor circuit.

20. The circuit of claim 19, wherein the absolute value of the high threshold voltage of the pull-down transistor of the word line drive circuit is equal to or larger than the absolute value of the potential of the negative potential supply line.

21. The circuit of claim 19, wherein the pull-down transistor of the word line drive circuit includes a parallel circuit having:

a transistor having a low threshold voltage of which a source line is connected to the ground line; and a transistor having a high threshold voltage of which a source line is connected to the negative potential supply line.

22. The circuit of claim 19, wherein in the semiconductor circuit, the transistor having a low threshold voltage is a transistor including a gate oxide film or threshold adjusting impurity formed for a transistor constituting a logic circuit that is high in leakage current but operates at high speed, and the transistor having a high threshold voltage is a transistor including a gate oxide film or threshold adjusting impurity formed for a transistor constituting a logic circuit that operates at low speed but is low in leakage current.

23. The circuit of claim 19, wherein in the semiconductor circuit, the transistor having a low threshold voltage is a transistor including a gate oxide film or threshold adjusting impurity formed for a transistor constituting a logic circuit, and the transistor having a high threshold voltage is a transistor including a gate oxide film or threshold adjusting impurity formed for a transistor constituting an analog circuit and/or an I/O circuit.

24. The circuit of claim 19, wherein the power supply voltage supplied to the semiconductor memory and the semiconductor circuit is 0.5 V to 1.2 V.

* * * * *